United States Patent
Hu et al.

(10) Patent No.: US 9,249,498 B2
(45) Date of Patent: Feb. 2, 2016

(54) FORMING MEMORY USING HIGH POWER IMPULSE MAGNETRON SPUTTERING

(75) Inventors: Yongjun Jeff Hu, Boise, ID (US); Everett A. McTeer, Eagle, ID (US); John A. Smythe, III, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 379 days.

(21) Appl. No.: 12/825,091

(22) Filed: Jun. 28, 2010

(65) Prior Publication Data
US 2011/0315543 A1 Dec. 29, 2011

(51) Int. Cl.
C23C 14/34 (2006.01)
C23C 14/08 (2006.01)
H01J 37/34 (2006.01)
H01L 21/02 (2006.01)
H01L 45/00 (2006.01)
C23C 14/35 (2006.01)

(52) U.S. Cl.
CPC .......... C23C 14/3485 (2013.01); C23C 14/082 (2013.01); C23C 14/088 (2013.01); H01J 37/3467 (2013.01); H01L 21/02192 (2013.01); H01L 45/147 (2013.01); H01L 45/1625 (2013.01); C23C 14/08 (2013.01); C23C 14/35 (2013.01); H01L 45/04 (2013.01); H01L 45/1233 (2013.01); H01L 45/146 (2013.01)

(58) Field of Classification Search
CPC .............. H01J 37/3467; C23C 14/3485; C23C 14/082; C23C 14/088; C23C 14/08; C23C 14/35; H01L 21/02192; H01L 45/04; H01L 45/1233; H01L 45/146; H01L 45/147; H01L 45/1625

USPC ............. 204/192.15, 192.2, 192.21, 192.22, 204/192.25
See application file for complete search history.

(56) References Cited

U.S. PATENT DOCUMENTS

| | | | |
|---|---|---|---|
| 6,197,678 B1 | 3/2001 | Yu et al. | |
| 6,296,742 B1 * | 10/2001 | Kouznetsov | 204/192.12 |
| 6,468,403 B1 * | 10/2002 | Shimizu et al. | 204/192.29 |
| 6,759,249 B2 | 7/2004 | Zhuang et al. | |
| 6,806,652 B1 * | 10/2004 | Chistyakov | 315/111.21 |
| 6,911,361 B2 | 6/2005 | Zhang et al. | |
| 7,063,984 B2 | 6/2006 | Nagashima et al. | |
| 7,147,759 B2 * | 12/2006 | Chistyakov | 204/192.12 |

(Continued)

FOREIGN PATENT DOCUMENTS

| | | |
|---|---|---|
| CN | 101473406 A | 7/2009 |
| CN | 101517122 A | 8/2009 |

(Continued)

OTHER PUBLICATIONS

Derwent Abstract of US 20090124483 A1.*

(Continued)

*Primary Examiner* — Michael Band
(74) *Attorney, Agent, or Firm* — Brooks, Cameron & Huebsch, PLLC (57) ABSTRACT

Forming memory using high power impulse magnetron sputtering is described herein. One or more method embodiments include forming a resistive memory material on a structure using high power impulse magnetron sputtering (HIPIMS), wherein the resistive memory material is formed on the structure in an environment having a temperature of approximately 400 degrees Celsius or less.

12 Claims, 4 Drawing Sheets

(56) References Cited

U.S. PATENT DOCUMENTS

| | | |
|---|---|---|
| 7,309,616 B2 | 12/2007 | Nagashima et al. |
| 7,326,979 B2 | 2/2008 | Rinerson et al. |
| 7,336,520 B2 | 2/2008 | Hachino et al. |
| 7,569,491 B2 | 8/2009 | Faguet |
| 8,384,061 B2 | 2/2013 | Mikawa et al. |
| 2004/0060813 A1 | 4/2004 | Chistyakov |
| 2004/0112735 A1* | 6/2004 | Saigal et al. ............. 204/192.12 |
| 2005/0098430 A1* | 5/2005 | Tuymer et al. ........... 204/298.08 |
| 2005/0266173 A1 | 12/2005 | Brcka |
| 2006/0066248 A1* | 3/2006 | Chistyakov .............. 315/111.21 |
| 2008/0026574 A1 | 1/2008 | Brcka |
| 2008/0053955 A1 | 3/2008 | Faguet |
| 2008/0057192 A1 | 3/2008 | Faguet |
| 2008/0175036 A1 | 7/2008 | Oh et al. |
| 2008/0217162 A1* | 9/2008 | Delrue et al. ............ 204/192.15 |
| 2008/0308781 A1 | 12/2008 | Liao et al. |
| 2009/0111216 A1 | 4/2009 | Weichart et al. |
| 2009/0124483 A1* | 5/2009 | Lin et al. ...................... 501/136 |
| 2010/0006426 A1 | 1/2010 | Sittinger et al. |
| 2010/0123117 A1 | 5/2010 | Sun et al. |
| 2010/0140578 A1 | 6/2010 | Tian et al. |
| 2010/0236919 A1* | 9/2010 | Alami et al. ............. 204/192.12 |
| 2010/0282598 A1 | 11/2010 | Ruske et al. |
| 2011/0005920 A1* | 1/2011 | Ivanov et al. ............ 204/192.13 |

FOREIGN PATENT DOCUMENTS

| | | |
|---|---|---|
| JP | 2007335471 A | 12/2007 |
| JP | 2010027753 A | 2/2010 |
| JP | 2010031359 A | 2/2010 |
| WO | 2009069252 A1 | 6/2009 |

OTHER PUBLICATIONS

International Search Report and Written Opinion for related PCT Application No. PCT/US2011/001100 dated Feb. 17, 2012 (11 pp.).

Won et al., "Resistive Switching Properties of Pt/TiO2/n+-Si ReRAM for Nonvolatile Memory Application," Electronics Materials Letters, vol. 4, No. 1, pp. 29-33, 2008.

Stranak et al., "Formation of TiOx Films Produced by High-Power Pulsed Magnetron Sputtering," Journal of Physics D: Applied Physics, vol. 41, pp. 1-6, 2008.

Lattemann et al., "Investigation of High Power Impulse Magnetron Sputtering Pretreated Interfaces for Adhesion Enhancement of Hard Coatings on Steel," Surface & Coatings Technology, vol. 200, pp. 6495-6499, 2006.

Notice of Preliminary Rejection from Korean patent application No. 10-2013-7001756, dated Jan. 15, 2014, 23 pp.

Taiwan Office Action from related Taiwan Application No. 100122714 issued Jul. 15, 2013 (5 pgs.).

First Office Action from related Chinese patent application No. 201180032068.2, dated May 6, 2014, 16 pp.

Alami, et al., "On the phase formation of titanium oxide films grown by reactive high power pulsed magnetron sputtering", Journal of Physics D: Applied Physics, issue 11, vol. 42, Jun. 7, 2009, pp. 1-5.

Second Office Action from related Chinese patent application No. 201180032068.2, dated Dec. 22, 2014, 16 pp.

* cited by examiner

FORMING MEMORY USING HIGH POWER IMPULSE MAGNETRON SPUTTERING

TECHNICAL FIELD

The present disclosure relates generally to semiconductor memory devices, methods, and systems, and more particularly, to forming memory using high power impulse magnetron sputtering.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, resistive random access memory (RRAM), and phase change random access memory (PCRAM), among others.

Memory devices such as resistive memory devices may be utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory devices such as resistive memory devices may include a number of memory cells, e.g., resistive memory cells, arranged in an array. For example, an access device, such as a diode, a field effect transistor (FET), or bipolar junction transistor (BJT), of the memory cells may be coupled to an access line, e.g., word line, forming a "row" of the array. The memory cell material, e.g., memory element, of each memory cell may be coupled to a data line, e.g., bit line, in a "column" of the array. In this manner, the access device of a memory cell may be accessed through a row decoder activating a row of memory cells by selecting the word line coupled to their gates. The programmed state of a particular memory cell in a row of selected memory cells may be determined, e.g., sensed, by causing different currents to flow in the memory elements depending on the resistance associated with a programmed state for the particular memory cell.

Memory cells such as resistive memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Resistive memory cells such as RRAM cells may store data by varying the resistance level of a resistive memory cell material, e.g., resistive memory element. For example, data may be programmed to a selected RRAM cell by applying sources of energy, such as positive or negative electrical pulses, e.g., positive or negative voltage or current pulses, to a particular RRAM cell material for a predetermined duration. RRAM cells may be programmed to a number of resistance levels by application of voltages or currents of various magnitudes, polarities, and/or durations.

RRAM, e.g., RRAM cells, may be formed using physical vapor deposition (PVD) methods, such as direct current (DC) sputtering or pulsed DC sputtering. However, RRAM formed using DC or pulsed DC sputtering may be formed in a high temperature environment, e.g. a PVD chamber having a high temperature, and/or have a low ionization, which may decrease the performance, consistency, and/or reliability of the RRAM. For example, the sensed resistance level of an RRAM cell formed using DC or pulsed DC sputtering may be different than the resistance level to which that cell was programmed. Further, RRAM formed using DC or pulsed DC sputtering may not be formed in a conventional PVD chamber, which may increase the cost and/or amount of time associated with forming the RRAM.

DETAILED DESCRIPTION

Forming memory using high power impulse magnetron sputtering is described herein. One or more method embodiments include forming a resistive memory material on a structure using high power impulse magnetron sputtering (HIPIMS), wherein the resistive memory material is formed on the structure in an environment having a temperature of approximately 400 degrees Celsius or less. In comparison, previous approaches may include forming memory in an environment having a temperature greater than 600 degrees Celsius.

Forming memory in accordance with one or more embodiments of the present disclosure, e.g., forming memory using HIPIMS, can increase the ionization of the resistive memory material, which can increase the performance, consistency, and/or reliability of the memory, as will be further described herein. For example, forming memory in accordance with one or more embodiments of the present disclosure can decrease the number of erroneous data reads associated with the memory, e.g., can decrease the number of times the sensed resistance level of the memory is different than the resistance level to which the memory was programmed, as will be further described herein. Additionally, memory formed in accordance with one or more embodiments of the present disclosure can be formed in a conventional physical vapor deposition chamber, which can decrease the cost and/or amount of time associated with forming the memory, as will be further described herein.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

Figure 3A:
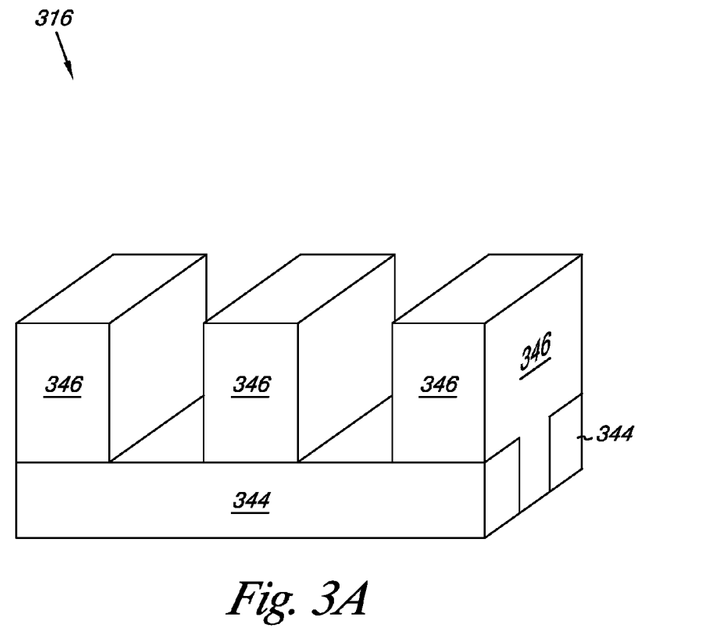
FIGS. 3A-3C illustrate a cross-sectional view of a structure in accordance with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 116 may reference element "16" in FIG. 1, and a similar element may be referenced as 316 in FIG. 3.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

As used herein, "a number of" something can refer to one or more such things. For example, a number of memory devices can refer to one or more memory devices.

Figure 1:
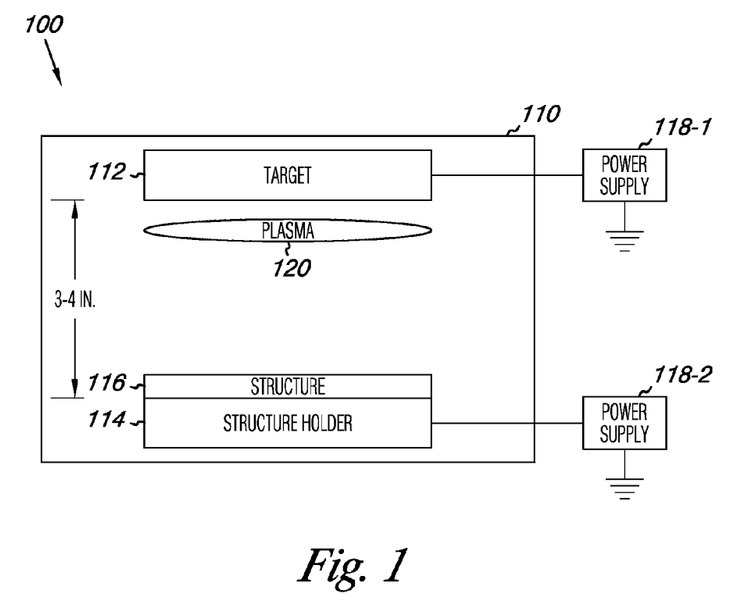
FIG. 1 illustrates a functional block diagram of a system for forming a memory material in accordance with one or more embodiments of the present disclosure.

FIG. 1 illustrates a functional block diagram of a system 100 for forming a memory material in accordance with one or more embodiments of the present disclosure. As shown in FIG. 1, system 100 includes environment 110. Environment 110 can be, for example, a conventional physical vapor deposition (PVD) chamber.

As shown in FIG. 1, environment 110 includes a single horizontally oriented target 112 having a flat surface facing toward a structure holder 114. Target 112 can be coupled to a power supply 118-1, and structure holder 114 can be coupled to a power supply 118-2. Power supplies 118-1 and 118-2 can be located outside environment 110, as illustrated in FIG. 1. However, embodiments of the present disclosure are not so limited, e.g., power supplies 118-1 and/or 118-2 can also be located within environment 110.

Target 112 can include a memory material, e.g., a memory cell material. For example, target 112 can be a cathode that includes a magnet or magnetron, and a memory material can be localized and/or trapped near and/or around a surface of the magnet or magnetron by magnetic and/or electric fields, as will be appreciated by one of ordinary skill in the art.

The memory material can be, for example, a resistive memory material, such as a resistive random access memory (RRAM) material. RRAM materials can include, for example, colossal magnetoresistive materials such as $Pr_{(1-x)}Ca_xMnO_3$ (PCMO), $La_{(1-x)}Ca_xMnO_3$ (LCMO), and $Ba_{(1-x)}Sr_xTiO_3$. RRAM materials can also include metal oxides, such as alkaline metal oxides, e.g., $Li_2O$, $Na_2O$, $K_2O$, $Rb_2O$, $Cs_2O$, BeO, MgO, CaO, SrO, and BaO, refractive metal oxides, e.g., NbO, $NbO_2$, $Nb_2O_5$, $MoO_2$, $MoO_3$, $Ta_2O_5$, $W_2O_3$, $WO_2$, $WO_3$, $Re_2$, $ReO_3$, and $Re_2O_7$, and binary metal oxides, e.g., $Cu_xO_y$, $WO_x$, $Nb_2O_5$, $Al_2O_3$, $Ta_2O_5$, $TiO_x$, $ZrO_x$, $Ni_xO$, and $Fe_xO$. RRAM materials can also include $Ge_xSe_y$, and other materials that can support solid phase electrolyte behavior. Other RRAM materials can include perovskite oxides such as doped or undoped $SrTiO_3$, $SrZrO_3$, and $BaTiO_3$, and polymer materials such as Bengala Rose, $AlQ_3Ag$, Cu-TCNQ, DDQ, TAPA, and Fluorescine-based polymers, among other types of RRAM materials. Embodiments of the present disclosure are not limited to a particular type of RRAM material. For example, the memory material can include various combinations of the above-listed RRAM materials. Further, the memory material can be capacitive or inductive.

Structure holder 114 can hold a structure 116, e.g., structure 116 can be placed on structure holder 114. As shown in FIG. 1, structure 116 can be placed on structure holder 114 such that structure 116 is approximately 3 to 4 inches away from target 112 in environment 110. Structure holder 114 can be, for example, an E-Chuck or wafer holder. However, embodiments of the present disclosure are not limited to a particular type of structure holder.

Structure 116 can be, for example, a memory structure, such as a substrate. The substrate can be, for example, a silicon substrate, such as a p-type silicon substrate. The substrate can be a silicon on insulator (SOI) substrate, a silicon on metal from wafer bonding, or a silicon on sapphire (SOS) substrate, among other types of substrates. The substrate can include other semiconductor materials, such as Ge, SiGe, GaAs, InAs, InP, CdS, and CdTe. Embodiments of the present disclosure are not limited to a particular type of substrate.

In one or more embodiments, system 100 can be configured to form the memory material in target 112 on structure 116 in environment 110 using high power impulse magnetron sputtering (HIPIMS), e.g., high power pulsed magnetron sputtering (HPPMS). For example, power supply 118-1 can provide, e.g., apply, power to target 112 in a pulsed (as opposed to constant) manner. That is, power supply 118-1 can provide power to target 112 by providing a number of pulses to target 112. Such application of power is referred to herein as a "pulse", "pulses", or "pulsing". Further, power supply 118-2 can provide a constant supply of power, e.g., a constant bias, to structure holder 114 and/or structure 116 while target 112 receives the pulses. A plasma 120 containing the memory material can be formed responsive to the pulses provided to target 112. The memory material corresponding to plasma 120 can be deposited on structure 116 in environment 110.

In one or more embodiments, each pulse provided to target 112 can have a power of at least 1 kilowatt. In some embodiments, each pulse provided to target 112 can have a power of at least 1 megawatt. For example, each pulse can have a power of approximately 18 megawatts. Additionally, in one or more embodiments, each pulse provided to target 112 can have a duration of approximately 1 to 300 microseconds. In some embodiments, each pulse provided to target 112 can have a duration of approximately 1 to 200 microseconds or a duration of approximately 100 to 200 microseconds. For example, each pulse can have a duration of approximately 100 microseconds. Further, in one or more embodiments, each pulse provided to target 112 can be separated by a duration of approximately 100 milliseconds. That is, there can be 100 milliseconds between each pulse provided to target 112. However, embodiments of the present disclosure are not limited to a particular duration.

Each pulse provided to target 112 can have equal amounts of power and/or equal durations. An example of pulses having equal amounts of power and equal durations will be described further in connection with FIG. 2A. However, embodiments of the present disclosure are not so limited. For example, each pulse provided to target 112 can have a different amount of power and/or a different duration.

The memory material that forms on structure 116 can have a thickness of less than 100 Angstroms. For example, the memory material that forms on structure 116 can have a thickness of approximately 40 to 70 Angstroms. Additionally, the memory material that forms on structure 116 can be crystallized, and may or may not include grain boundaries vertical to structure 116.

Memory material formed on structure 116 in accordance with one or more embodiments of the present disclosure can be formed on structure 116 in a low temperature environment, e.g., an environment having a temperature of approximately 400 degrees Celsius or less. That is, environment 110 can have a low temperature, e.g., approximately 400 degrees Celsius or less, while the memory material is being formed on structure 116. Additionally, memory material formed on structure 116 in accordance with one or more embodiments of the present disclosure can have a high ionization, e.g., an ionization of at least 80%. For example, the memory material formed on structure 116 can have an ionization of approximately 80%-95%. That is, approximately 80%-95% of the atoms and/or molecules in the memory material formed on structure 116 can be ionized. This relatively high ionization, as compared to previous approaches, can have benefits such as providing low temperature crystallization, among other benefits.

Because the memory material formed on structure 116 can be formed in a low temperature environment, and/or because the memory material formed on structure 116 can have a high ionization, memory, e.g., memory cells, having the memory material formed on structure 116 can perform accurately and/or reliably. For example, memory having the memory material formed on structure 116 can have a low number of erroneous data reads associated with the memory, e.g., the number of times the sensed resistance level of the memory is different than the resistance level to which the memory was programmed can be low.

Additionally, memory material formed on structure 116 in accordance with one or more embodiments of the present disclosure can be formed on structure 116 in a conventional physical vapor deposition (PVD) chamber. That is, environment 110 can be a conventional PVD chamber. For example, environment 110 can include a single target 112 having a surface that is horizontally oriented and facing toward structure holder 114 and structure 116 from approximately 3 to 4 inches away, as previously described herein. Because the memory material formed on structure 116 can be formed in a conventional PVD chamber, memory, e.g., memory cells, having the memory material formed on structure 116 can be formed at a reduced cost and/or in a reduced amount of time, as compared to previous approaches.

After the memory material is formed on structure 116, additional processing steps can be performed to form individual memory cells, as will be appreciated by one of ordinary skill in the art. For example, portions of the memory material and/or structure 116 can be removed, e.g., etched. Further, additional materials, such as insulator materials and/or electrodes, can be formed, e.g., deposited, on the memory material and/or structure 116. The additional processing steps can be performed in environment 110 and/or in an environment other than environment 110.

Figure 2A:
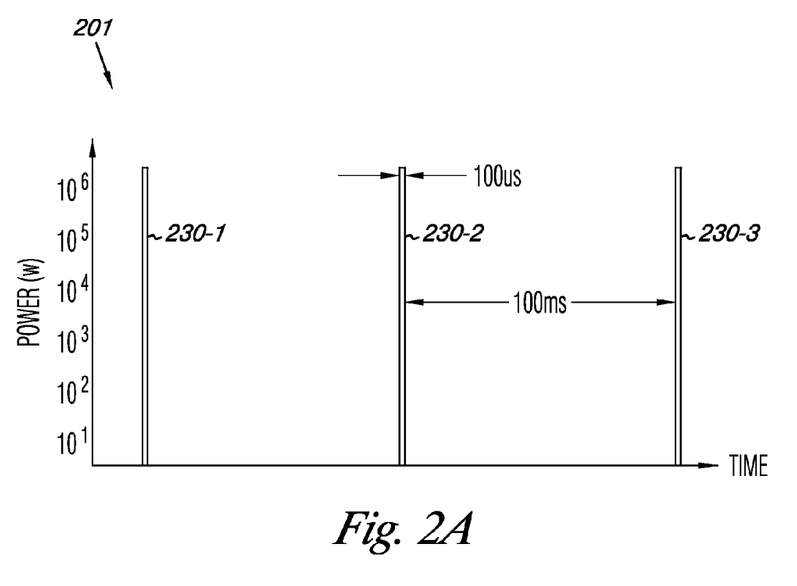
FIG. 2A illustrates a graph of a number of pulses in accordance with one or more embodiments of the present disclosure.

FIG. 2A illustrates a graph 201 of a number of pulses, e.g., first pulse 230-1, second pulse 230-2, and third pulse 230-3, in accordance with one or more embodiments of the present disclosure. In an embodiment of the present disclosure, pulses 230-1, 230-2, and 230-3 can be applied to target 112 described in connection with FIG. 1, forming a plasma 120 comprising, e.g., containing and/or made of, the memory material. That is, pulses 230-1, 230-2, and 230-3 can be used to deposit a memory material to form memory in accordance with one or more embodiments of the present disclosure.

As shown in FIG. 2A, pulses 230-1, 230-2, and 230-3 can each have a power of approximately 1 megawatt. Additionally, each pulse 230-1, 230-2, and 230-3 can be provided to a target, e.g., target 112 described in connection with FIG. 1, for a duration of approximately 100 microseconds. Further, each pulse 230-1, 230-2, and 230-3 is separated by a duration of approximately 100 milliseconds. That is, second pulse 230-2 can be provided to a target approximately 100 milliseconds after first pulse 230-1 is provided to the target, and third pulse 230-3 can be provided to the target approximately 100 milliseconds after second pulse 230-2 is provided to the target. Further, in the embodiment illustrated in FIG. 2A, no additional pulses are provided to the target after first pulse 230-1 is provided to the target and before second pulse 230-2 is provided to the target, and no additional pulses are provided to the target after second pulse 230-2 is provided to the target and before third pulse of 230-3 is provided to the target.

Although three pulses are illustrated in FIG. 2A, embodiments of the present disclosure are not limited to a particular number of pulses. Additionally, although the pulses shown in FIG. 2A have the same power and the same duration, embodiments of the present disclosure are not so limited. For example, pulses in accordance with the present disclosure can have different amounts of power and/or different durations, as previously described herein. Further, embodiments of the present disclosure are not limited to pulses having a power of approximately 1 megawatt or a duration of approximately 100 microseconds. For example, one or more embodiments of the present disclosure can include pulses having a power of at least 1 kilowatt and/or pulses having a duration of approximately 1 to 300 microseconds, as previously described herein.

Figure 2B:
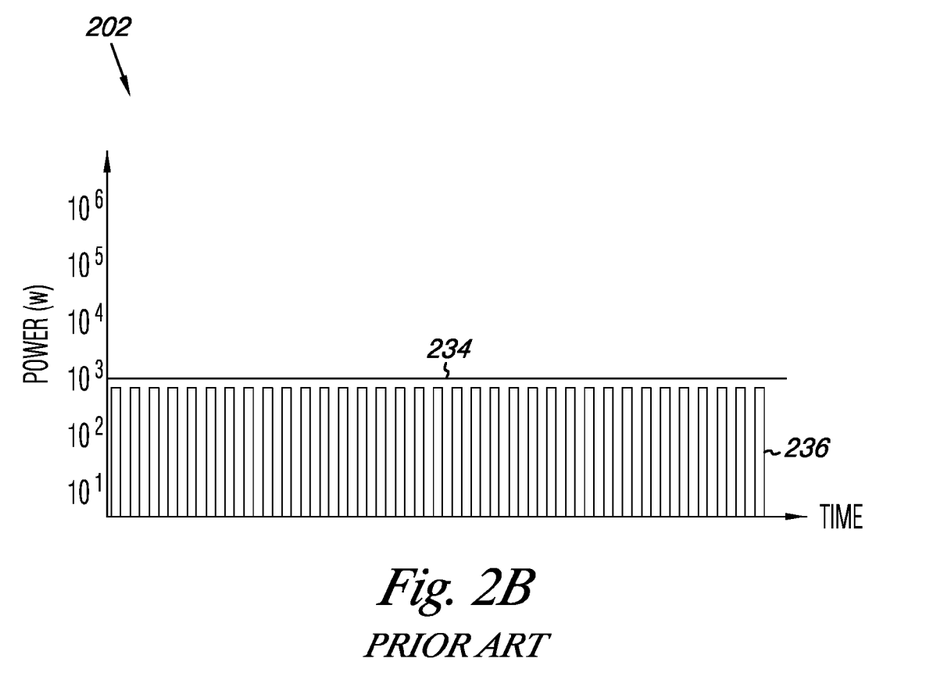
FIG. 2B illustrates a graph of various power quantities that can be provided to a target to form memory in accordance with previous approaches.

FIG. 2B illustrates a graph 202 of various power quantities, e.g., power quantity 234 and power quantity 236, that can be provided to a target, e.g., a target having a memory material, to form memory in accordance with previous approaches, e.g., previous physical vapor deposition (PVD) methods. Power quantity 234 can be associated with direct current (DC) sputtering, and power quantity 236 can be associated with pulsed DC sputtering.

As shown in FIG. 2B, power quantity 234 can include a single, constant, e.g., continuous, power supply. That is, DC sputtering can include providing a single, constant supply of power, for example of approximately 1 kilowatt, to a target having a memory material. In contrast, one or more embodiments of the present disclosure include a number of pulses, such as the pulses described in connection with FIG. 2A.

Power quantity 236 can include a number of pulses, as illustrated in FIG. 2B. That is, pulsed DC sputtering can include providing a number of pulses to a target having a memory material. However, the pulses associated with power quantity 236 have a lower power and a longer duration than the pulses associated with one or more embodiments of the present disclosure, e.g., the pulses illustrated in FIG. 2A. For example, each pulse associated with power quantity 236 can have a power of approximately 0.8 kilowatts and a duration of approximately 200 microseconds. In contrast, pulses 230-1, 230-2, and 230-3 illustrated in FIG. 2A each have a power of approximately 1 megawatt and a duration of approximately 100 microseconds, as previously described herein.

Further, the amount of time between each pulse associated with power quantity 236 is less than the amount of time between the pulses associated with one or more embodiments of the present disclosure. For example, each pulse associated with power quantity 236 can be separated by a duration of approximately 10 milliseconds. In contrast, pulses 230-1, 230-2, and 230-3 illustrated in FIG. 2A are separated by a duration of approximately 100 milliseconds, as previously described herein.

Memory formed in accordance with previous approaches, e.g., DC sputtering and pulsed DC sputtering, may be formed in a high temperature environment, e.g., an environment having a temperature of greater than 600 degrees Celsius. In contrast, memory formed in accordance with one or more embodiments of the present disclosure can be formed in a low temperature environment, e.g., an environment having a temperature of approximately 400 degrees Celsius or less, as previously described herein. Additionally, memory material formed in accordance with previous approaches, e.g., DC sputtering and pulsed DC sputtering, may have a low ionization, e.g., an ionization of less than 80%. In contrast, memory material formed in accordance with one or more embodiments of the present disclosure can have a high ionization, e.g., an ionization of at least 80%, as previously described herein.

Because memory formed in accordance with previous approaches may be formed in a high temperature environment, and/or because memory material formed in accordance with previous approaches may have a low ionization, memory formed in accordance with previous approaches may not perform accurately and/or reliably. For example, memory formed in accordance with previous approaches may have a high number of erroneous data reads associated with the memory, e.g., the number of times the sensed resistance level of the memory is different than the resistance level to which the memory was programmed may be high. In contrast, memory formed in accordance with one or more embodiments of the present disclosure can perform accurately and/or reliably, as previously described herein.

Additionally, memory formed in accordance with previous approaches, e.g., DC sputtering and pulsed DC sputtering, may be formed in an unconventional PVD chamber, e.g., a PVD chamber having a vertically oriented target, a target that is a hollow cathode having a hollow magnet or magnetron, a target that faces away from a structure holder and/or a memory structure in the PVD chamber, multiple targets that face toward each other, a target having a curved surface such as a bell-shaped surface, and/or a target that is approximately 12-16 inches away from a memory structure in the PVD chamber. In contrast, memory formed in accordance with one or more embodiments of the present disclosure can be formed in a conventional PVD chamber, as previously described herein.

Because memory formed in accordance with previous approaches may be formed in an unconventional PVD chamber, memory formed in accordance with previous approaches may be formed at a high cost and/or in a large amount of time. In contrast, memory formed in accordance with one or more embodiments of the present disclosure can be formed at a reduced cost and/or in a reduced amount of time, as previously described herein.

Figure 3B:
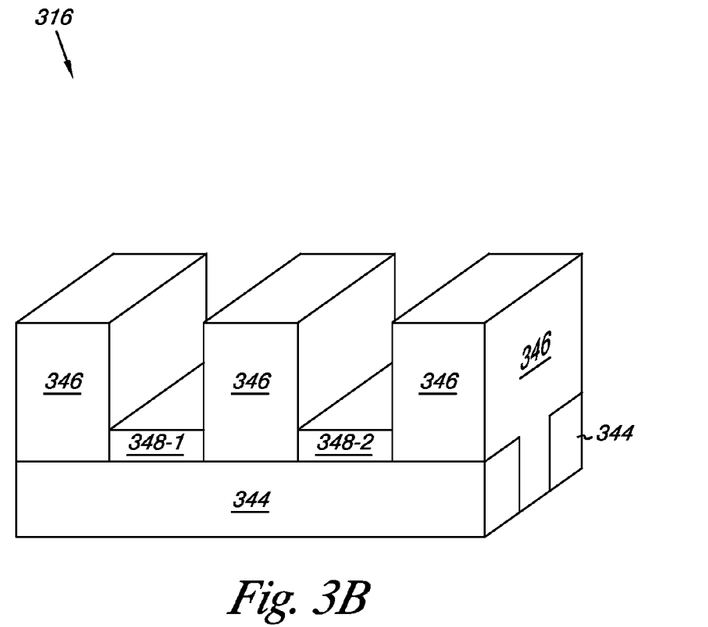
Figure 3C:
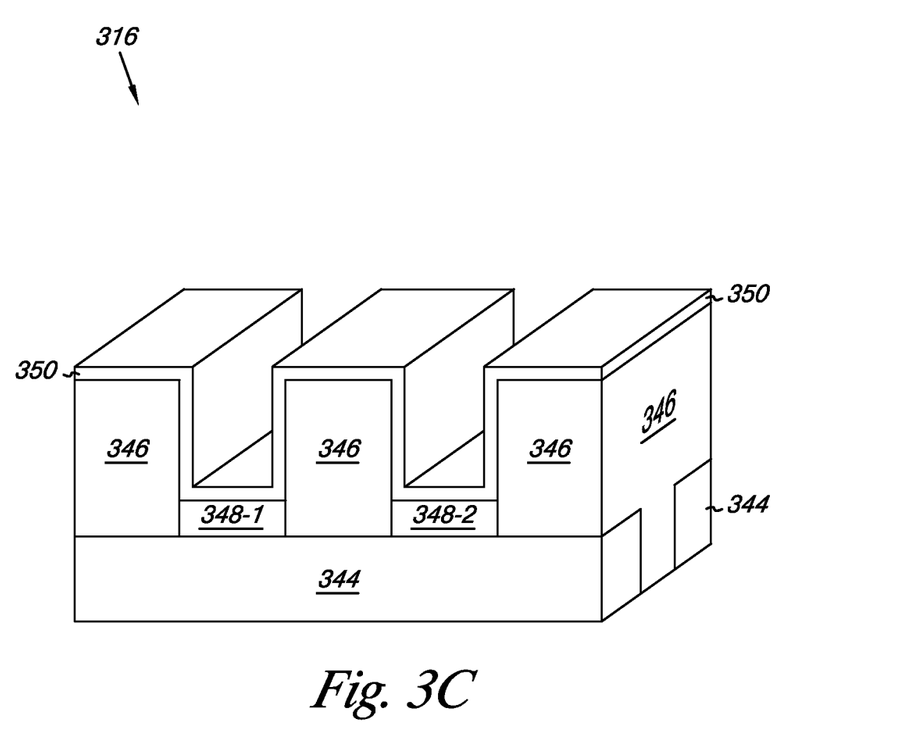

FIGS. 3A-3C illustrate a cross-sectional view of a structure 316 in accordance with one or more embodiments of the present disclosure. FIG. 3A illustrates, e.g., a damascene structure 316 prior to the formation of electrodes, e.g., electrodes 348-1 and 348-2 shown in FIGS. 3B and 3C, and a memory material, e.g., memory material 350 shown in FIG. 3C, thereon. FIG. 3B illustrates structure 316 after the formation of electrodes, e.g., bottom electrodes, 348-1 and 348-2 thereon. FIG. 3C illustrates structure 316 after the formation of memory material 350 thereon. Structure 316 can correspond to structure 116 described in connection with FIG. 1.

As shown in FIGS. 3A-3C, structure 316 includes a bit line dielectric 346 formed on word line conductor 344. Prior to arriving at the configuration shown in FIG. 3A, bit line dielectric 346 was patterned to form openings in bit line dielectric 346 shown in FIG. 3A, as will be appreciated by one of ordinary skill in the art. Electrodes 348-1 and 348-2 can then be formed on structure 316, e.g., on word line conductor 344 in the openings in bit line dielectric 346, as shown in FIG. 3B. Electrodes 348-1 and 348-2 can be formed on word line conductor 344 in the openings in bit line dielectric 346 in a number of ways, as will appreciated by one of skill in the art.

Memory material 350 can then be formed on structure 316, e.g., on bit line dielectric 346 and on electrodes 348-1 and 348-2 in the openings in bit line dielectric 346, as shown in FIG. 3C. Memory material 350 can be formed on structure 316 by forming plasma, e.g., plasma 120 described in connection with FIG. 1, having memory material 350, and forming the memory material 350 in the plasma on structure 316. The plasma can be formed by providing a number of pulses to a target, e.g., target 112 described in connection with FIG. 1, having memory material 350, in accordance with one or more embodiments of the present disclosure. That is, memory material 350 can correspond to the memory material in plasma 120 and/or target 112 previously described in connection with FIG. 1.

Memory material 350 can have a thickness of less than 100 Angstroms. For example, memory material 350 can have a thickness of approximately 40 to 70 Angstroms. Additionally, memory material 350 can be crystallized, and may or may not include grain boundaries vertical to structure 316.

After memory material 350 is formed on structure 316, additional processing steps can be performed to form individual memory cells, as will be appreciated by one of ordinary skill in the art. For example, portions of memory material 350 and/or structure 316 can be removed, e.g., etched. Further, additional materials, such as insulator materials and/or electrodes, can be formed, e.g., deposited, on memory material 350 and/or structure 316.

Conclusion

Forming memory using high power impulse magnetron sputtering is described herein. One or more method embodiments include forming a resistive memory material on a structure using high power impulse magnetron sputtering (HIPIMS), wherein the resistive memory material is formed on the structure in an environment having a temperature of approximately 400 degrees Celsius or less.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing memory, comprising:
forming a resistive memory material from a target on a structure by:
forming plasma comprising the resistive memory material from the target using high power impulse magnetron sputtering (HIPIMS); and
forming the resistive memory material in the plasma on the structure;
wherein forming the resistive memory material on the structure includes providing a number of pulses to the target, wherein each pulse of the number of pulses has a constant amount of power of at least 1 megawatt for a duration of the pulse, wherein each pulse of the number of pulses has a duration of approximately 1 to 300 microseconds;
wherein the resistive memory material is formed on the structure in an environment having a temperature of approximately 400 degrees Celsius or less;
wherein the resistive memory material included in the target is $Pr_{(1-x)}Ca_xMnO_3$ (PCMO); and
wherein the resistive memory material is formed on the structure such that the resistive memory material on the structure has a thickness of less than 100 Angstroms.

2. The method of claim 1, wherein the method of providing the number of pulses includes providing a second pulse to the target approximately 100 milliseconds after a first pulse is provided to the target.

3. The method of claim 2, wherein the first and second pulses are provided to the target for a duration of approximately 100 to 200 microseconds.

4. A method of processing memory, comprising:
forming a resistive memory material from a target on a structure by:
forming plasma comprising the resistive memory material from the target using high power impulse magnetron sputtering (HIPIMS); and
forming the resistive memory material in the plasma on the structure;
wherein forming the resistive memory material on the structure includes providing a number of pulses to the target, wherein each pulse of the number of pulses has a duration of 1 to 300 microseconds and a constant amount of power of at least 1 megawatt for the duration of the pulse;
wherein the resistive memory material is formed on the structure in an environment having a temperature of approximately 400 degrees Celsius or less and such that the resistive memory material on the structure has an ionization of at least 80%; and
wherein the resistive memory material included in the target is $Pr_{(1-x)}Ca_xMnO_3$(PCMO); and
wherein the resistive memory material is formed on the structure such that the resistive memory material on the structure has a thickness of less than 100 Angstroms.

5. The method of claim 2, wherein forming the resistive memory material on the structure includes providing no additional pulses to the target after the first pulse is provided to the target and before the second pulse is provided to the target.

6. The method of claim 4, wherein each pulse of the number of pulses have a power of approximately 18 megawatts.

7. The method of claim 4, wherein each pulse of the number of pulses has a duration of approximately 100 microseconds.

8. The method of claim 4, wherein the resistive memory material is formed on the structure such that the resistive memory material on the structure has an ionization of approximately 80% to 95%.

9. A method of processing memory, comprising:
forming a resistive random access memory (RRAM) cell material from a target on a memory structure by:
forming plasma comprising the RRAM cell material from the target using high power impulse magnetron sputtering (HIPIMS); and
forming the RRAM cell material in the plasma on the memory structure;
wherein forming the RRAM cell material on the memory structure includes providing a number of pulses to the target, wherein each pulse of the number of pulses has a duration of approximately 1 to 300 microseconds and a constant amount of power of at least 1 megawatt for the duration of the pulse;
wherein the RRAM cell material is formed on the memory structure in a physical vapor deposition (PVD) chamber having a temperature of approximately 400 degrees Celsius or less;
wherein the RRAM cell material included in the target is $Pr_{(1-x)}Ca_xMnO_3$ (PCMO); and
wherein the RRAM cell material is formed on the memory structure such that the RRAM cell material on the memory structure has a thickness of 40 to 70 Angstroms.

10. The method of claim 9, wherein the method includes providing a constant supply of power to the memory structure while forming the RRAM cell material on the memory structure.

11. The method of claim 9, wherein:
the memory structure includes an opening; and
the RRAM cell material is formed in the opening.

12. The method of claim 9, wherein the method includes forming the RRAM cell material on the memory structure such that the RRAM cell material on the memory structure is crystallized.

* * * * *